United States Patent
Tay et al.

(10) Patent No.: US 12,041,730 B2
(45) Date of Patent: Jul. 16, 2024

(54) COMPONENT CARRIER WITH LOW-SOLVENT FIBER-FREE DIELECTRIC LAYER

(71) Applicant: AT&S Austria Technologie & Systemtechnik Aktiengesellschaft, Leoben (AT)

(72) Inventors: Seok Kim Tay, Singapore (SG); Mikael Tuominen, Pernio (FI); Kim Liu, Kunshan (CN)

(73) Assignee: AT&SAustria Technologie & Systemtechnik AG, Leoben (AT)

( * ) Notice: Subject to any disclaimer, the term of this patent is extended or adjusted under 35 U.S.C. 154(b) by 0 days.

(21) Appl. No.: 17/446,741

(22) Filed: Sep. 2, 2021

(65) Prior Publication Data
US 2022/0078923 A1   Mar. 10, 2022

(30) Foreign Application Priority Data
Sep. 4, 2020   (CN) .......................... 202010922679.5

(51) Int. Cl.
*H05K 3/46*   (2006.01)
*H01L 21/48*   (2006.01)
*H01L 23/498*   (2006.01)
*H05K 1/18*   (2006.01)

(52) U.S. Cl.
CPC ....... *H05K 3/4655* (2013.01); *H01L 21/4857* (2013.01); *H01L 23/49822* (2013.01); *H05K 1/185* (2013.01); *H05K 2203/111* (2013.01)

(58) Field of Classification Search
CPC ............. H05K 2203/111; H05K 1/185; H05K 3/4655; H05K 3/46; H01L 23/49822; H01L 21/4857
USPC ........................................................ 361/761
See application file for complete search history.

(56) References Cited

U.S. PATENT DOCUMENTS

| | | | |
|---|---|---|---|
| 6,376,008 B1 * | 4/2002 | Steiner | B32B 37/26 174/250 |
| 2006/0275616 A1 | 12/2006 | Clough et al. | |
| 2016/0244596 A1 | 8/2016 | Piotrowski et al. | |
| 2017/0278630 A1 * | 9/2017 | Ito | H01F 5/003 |
| 2018/0148541 A1 | 5/2018 | Ho et al. | |
| 2023/0229081 A1 * | 7/2023 | Shu | C08G 59/245 430/280.1 |

FOREIGN PATENT DOCUMENTS

EP    2 484 710 A1    8/2012
JP    2009173017 A    8/2009

* cited by examiner

*Primary Examiner* — Tremesha S Willis
(74) *Attorney, Agent, or Firm* — Robert A. Blaha; Smith Tempel Blaha LLC

(57) ABSTRACT

A method of manufacturing a component carrier is described. The method includes forming a stack with at least one electrically conductive layer structure and at least one electrically insulating layer structure, and reducing an amount of solvent in a fiber-free dielectric layer, which is directly connected to a metal layer, so that the dielectric layer with reduced amount of solvent remains at least partially uncured.

14 Claims, 2 Drawing Sheets

COMPONENT CARRIER WITH LOW-SOLVENT FIBER-FREE DIELECTRIC LAYER

TECHNICAL FIELD

Embodiments of the invention generally relate to a method of manufacturing a component carrier, and to a component carrier.

TECHNOLOGICAL BACKGROUND

In the context of growing product functionalities of component carriers equipped with one or more electronic components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

However, laminate-type component carriers, in particular when including one or more RCC (resin coated copper) structures, may suffer from performance and reliability issues, such as delamination or warpage.

SUMMARY

There may be a need for a component carrier which can be manufactured in a reliable way and which can be operated with high performance.

According to an exemplary embodiment of the invention, a method of manufacturing a component carrier is provided, wherein the method comprises forming a stack comprising at least one electrically conductive layer structure and at least one electrically insulating layer structure, reducing an amount of solvent in a fiber-free dielectric layer, which is directly connected to a metal layer, in such a way that the dielectric layer with reduced amount of solvent remains at least partially uncured, and—optionally—thereafter laminating the fiber-free dielectric layer together with the metal layer to the stack by at least partially curing the dielectric layer.

According to another exemplary embodiment of the invention, a component carrier is provided, wherein the component carrier comprises a stack comprising at least one electrically conductive layer structure and at least one electrically insulating layer structure, and a fiber-free dielectric layer laminated to the stack and having a solvent concentration of less than 0.15 weight percent in relation to the overall weight of the fiber-free dielectric layer, wherein the dielectric layer is arranged directly between the stack and an additional metal layer (wherein the dielectric layer and the metal layer may form a double layer, i.e., an integral structure of two connected layers, such as an RCC).

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another. The layer structures of the stack may be connected by lamination, i.e., the application of heat and/or pressure.

In the context of the present application, the term "layer structure" may particularly denote a continuous layer, a patterned layer, or a plurality of non-consecutive islands within a common plane.

In the context of the present application, the term "solvent" may particularly denote a substance in which solids may dissolve. A solvent may be a liquid, but can also be or comprise a solid, a gas and/or a supercritical fluid. Such a solvent may belong to one or more of the following substance classes: alcohols, ketones, glycol derivatives, amides, benzene derivatives and cyclic or aliphatic hydrocarbons. For instance, the solvent may comprise one or more of the following solvents: alcohols, such as ethanol or 1-methoxy 2-propanol, ketones, such as methyl ethyl ketone or cyclohexanone, glycol derivatives, such as propylene glycol methyl ether acetate or diethylene glycol monoethyl ether acetate, amides such as dimethylformamide, benzene derivatives, such as toluene, or cyclic and/or aliphatic (saturated or non-saturated) hydrocarbons, such as naphtha.

In the context of the present application, the term "fiber-free dielectric layer" may particularly denote a dielectric layer comprising one or more constituents, but no reinforcing fibers. In particular, a fiber-free dielectric layer does not comprise glass fibers or glass cloth. Such glass fibers or glass cloth may be used in materials such as prepreg or FR4 for mechanical reinforcing purposes. For example, a fiber-free dielectric layer may comprise resin (such as epoxy resin), solvent, and optionally filler particles. Said filler particles may provide the fiber-free dielectric layer with a corresponding property or function, such as an increased thermal conductivity. However, no fibers are present in such a fiber-free dielectric layer.

In the context of the present application, the term "directly connected" may particularly denote that two layer or layer structures (such as the dielectric layer and the metal layer) may be connected with each other with direct physical contact, i.e., without a further structure in between. A person skilled in the art will however understand that an extremely thin seed layer, an adhesion promoter or the like may or may not be arranged between directly connected layers or layer structures. However, two directly connected layers do not have a substantial amount of material in between.

In the context of the present application, the term "at least partially uncured dielectric layer" may particularly denote a dielectric layer being fully uncured (for instance A-stage resin) or being only partially uncured (for instance B-stage resin), but not fully cured (for instance C-stage resin). A-stage denotes a stage in the reaction of some thermosetting resins in which the material is fusible and soluble in certain liquids. B-stage denotes an intermediate reaction stage of some thermosetting resins where material softens when heat is applied, wherein this stage may not entirely dissolve or fuse. C-Stage denotes a final reaction stage of some thermosetting resins where the epoxy resin is substantially insoluble and infusible, in particular fully cured. An at least partially uncured dielectric layer is still capable of undergoing a curing process by which the dielectric material may become temporarily flowable and/or may polymerize and/or may cross-link. After the curing process, the at least partially uncured dielectric layer re-solidifies. During the above-mentioned lamination procedure, the at least partially uncured material re-melts and flows into gaps in its environments, and may for instance fully cure thereby.

In the context of the present application, the term "at least partially curing the dielectric layer" may particularly denote only partially or fully curing the dielectric layer. Only partially curing may involve treating material of the dielectric layer to become flowable and/or to polymerize and/or to cross-link in such a way, that such a curing treatment can be repeated later by still not fully cured material of the dielectric layer. Fully curing may involve treating material of the dielectric layer to become flowable and/or to polymerize and/or to cross-link in such a way, that such a curing treatment cannot be repeated again, since the material of the dielectric layer has already completed curing. Such material may not become flowable again.

In the context of the present application, the term "laminating" may particularly denote a process of connecting layers, layer structures and/or layer stacks, wherein the connection may be triggered by the application of heat and/or pressure. In particular, lamination may make an at least partially uncured but still flowable dielectric (such as epoxy resin or any other appropriate polymer) temporarily liquid or viscous, as polymerization or cross-linking may occur, whereas thereafter the dielectric may become re-solidified again. As a result, lamination between layers, layer structures and/or layer stacks may be obtained, wherein the now cured dielectric may adhere the layers, layer structures and/or layer stacks together.

According to an exemplary embodiment of the invention, a manufacturing architecture for manufacturing component carriers (such as printed circuit boards (PCBs) or integrated circuit (IC) substrates) is provided. In such a manufacturing architecture, the performance and/or reliability of the readily manufactured component carriers may be improved by pre-treating a double layer composed of a metal layer and a dielectric layer directly on the metal layer prior to laminating the double layer to a layer stack of the component carrier. Said pre-treatment may be specifically adapted for removing part of solvent in the dielectric layer of the double layer prior to the lamination. While solvent in the dielectric layer may be required for the manufacturing process of the double layer (for instance an RCC (resin coated copper) structure), an excessive amount of solvent in the dielectric layer of the double layer may be a cause for reliability and performance issues of a component carrier manufactured by laminating the double layer to a layer stack. Without wishing to be bound to a specific theory, it is presently believed that the metal layer of the double layer functions as a barrier for solvent evaporation out of the dielectric layer during lamination. Hence, only an insufficient amount of solvent may be removed out of the dielectric layer during lamination. A remaining excess of solvent in the readily manufactured component carrier may thereby deteriorate its properties in terms of reliability and performance, and may cause issues such as delamination and warpage. Advantageously, the at least partially uncured dielectric layer forming a compound together with the metal layer may be pre-treated (for instance by pre-baking) according to an exemplary embodiment prior to lamination with the stack in a way that excessive solvent is removed from the dielectric layer without fully curing the dielectric layer during the pre-treatment. Without wishing to be bound to a specific theory, a purpose may be to keep the temperature during pre-baking below the glass-transition temperature of the involved resin(s). Thereby, cross-linking of the resin (as an example for curing) is limited and the resin may be unable to fully cure during the pre-treatment. Such a solvent removal may be efficient since the dielectric layer may be exposed during such a pre-treatment. The controlled reduction of the amount of solvent out of the dielectric layer prior to lamination with the stack may also advantageously allow to properly adjust the physical properties of the obtained component carrier, for instance in terms of glass transition temperature, value of the Young modulus, etc. Highly advantageously, the avoidance of a full curing of the dielectric layer by the solvent removal process prior to stack lamination may maintain the capability of the dielectric layer of becoming flowable by supplying heat and/or pressure during said subsequent lamination. During said lamination, resin of the dielectric layer may hence become flowable, may cure and may be re-solidified. By said process, the previously at least partially uncured dielectric layer may function as adhesive between the metal layer and the stack. Hence, the preferably thermally triggered partial solvent removal of the dielectric layer prior to lamination may be advantageously limited so that the supply of thermal energy does not cause full curing, but only semi-curing of the dielectric layer. By taking this measure, a high reliability and performance of the manufactured component carrier may be combined with a proper adhesion between double layer and layer stack after lamination. When the dielectric layer is free of reinforcing fibers, it can be properly and easily processed after lamination, for instance for forming copper filled laser vias on and/or in such a dielectric layer.

In the following, further exemplary embodiments of the method and the component carrier will be explained.

In an embodiment, the method comprises reducing the amount of solvent in the fiber-free dielectric layer by pre-heating the fiber-free dielectric layer. Heating the dielectric layer in a common compound with the metal layer may evaporate solvent in the dielectric layer without fully curing the dielectric layer. This removes excessive solvent while maintaining the capability of the partially uncured dielectric layer to serve as adhesive during lamination with the stack.

In an embodiment, the pre-heating comprises pre-heating the fiber-free dielectric layer to an elevated temperature above ambient temperature but below the glass transition temperature (Tg) of resin of the fiber-free dielectric layer. The removal of the solvent may strongly depend on the solvent added to the epoxy. More specifically, an appropriate temperature during the pre-treatment depends on the solvents' boiling point(s). Hence, heating may be highly appropriate when carried out at an elevated temperature and below the Tg of the resin used.

In an embodiment, the pre-heating comprises pre-heating the fiber-free dielectric layer up to a temperature in a range from 60° C. to 160° C., in particular in a range from 80° C. to 100° C. A minimum temperature of 60° C., preferably of 80° C., ensures that a sufficient amount of solvent is removed by evaporation. At the same time, a maximum temperature of 160° C., preferably of 100° C., guarantees that at least partially uncured resin of the dielectric layer is prevented from fully curing, which may be triggered by a sufficiently high thermal impact. Hence, the mentioned temperature ranges may result in a high performance and highly reliable component carrier due to a sufficiently small amount of remaining solvent while simultaneously suppressing any delamination tendency due to the maintained adhesive property of the at least partially uncured resin upon lamination.

In an embodiment, the method comprises reducing the amount of solvent in the fiber-free dielectric layer by applying a negative pressure. Hence, the removal of solvent may also be accomplished by applying a vacuum or a low pressure. By this manner, it may be possible to further reduce the applied temperature, which may lead to less curing of the resin during pre-baking. With this manner, it may be possible to keep the temperature below the glass transition temperature of the resin, simultaneously removing solvent at lower temperatures.

Applying a negative pressure for reducing the solvent concentration temperature may be carried out additionally (in particular simultaneously with) or alternatively to the above-mentioned pre-heating. In particular, it may be possible to apply a negative pressure during pre-baking.

In an embodiment, the pre-heating comprises pre-heating the fiber-free dielectric layer for a preheating time in a range from 5 minutes to 20 minutes, in particular in a range from 5 minutes to 10 minutes. In a similar way as with the mentioned temperature ranges, also the mentioned temporal ranges of pre-preheating or pre-baking forces a sufficiently pronounced portion of the solvent to be removed from the dielectric layer while its still curable character may be maintained to a sufficient degree.

In an embodiment, the method comprises partially curing the fiber-free dielectric layer during the reducing of the amount of solvent. A partially cured fiber-free dielectric layer may be in B-stage. Thus, reduction of the solvent content of the dielectric layer by pre-baking may result in a semi-cured resin content of the solvent depleted dielectric layer, for instance due to partial polymerization or partial cross-linking. However, the ability of the resin to perform additional polymerization or cross-linking may be maintained regardless of the solvent reduction by pre-treating, which ensures a proper lamination without subsequent delamination tendencies in an interior of the component carrier.

In an embodiment, the method comprises fully curing the fiber-free dielectric layer by laminating. A fully cured fiber-free dielectric layer may be in C-stage. Only by lamination, i.e., the supply of further heat and/or mechanical pressure between the double layer (for instance an RCC structure) and the (in particular already fully cured or at least partially uncured) stack, curing of the resin of the dielectric layer may be completed. This ensures proper connection between stack and double layer.

In an embodiment, the method comprises laminating the fiber-free dielectric layer to the stack at a temperature of at least 180° C., in particular at least 200° C. Hence, the temperature applied for lamination may be larger than the temperature applied for pre-baking. This ensures that pre-baking only removes solvent without fully curing, while the lamination may convert the dielectric layer in a fully or substantially fully cured configuration.

In an embodiment, the method comprises, after laminating the fiber-free dielectric layer to the stack, post-heating the fiber-free dielectric layer, the metal layer and the stack up to a temperature in a range from 120° C. to 260° C., in particular in a range from 140° C. to 200° C. Such a post-heating procedure may be carried out for further strengthening the interconnection in an interior of the component carrier. Apart from this, said post-heating, which may be carried out at a remarkably high temperature, may remove a further portion of remaining solvent from the dielectric layer. Descriptively speaking, post-heating may thus be implemented as a third solvent removal stage after pre-preheating and lamination.

In an embodiment, the method comprises reducing the amount of solvent of the fiber-free dielectric layer by pre-treating before the lamination up to less than 1.5 weight percent, in particular up to less than 1 weight percent, in relation to the overall weight of the fiber-free dielectric layer. Such sufficiently small remaining amounts of solvent in the double layer of dielectric layer and metal layer may be compatible with the manufacture of a highly reliable component carrier with high performance, in view of an additional loss of solvent by lamination.

In an embodiment, the method comprises further reducing the amount of solvent of the fiber-free dielectric layer by the laminating up to less than 0.15 weight percent, in particular up to less than 0.1 weight percent, more particularly up to less than 0.05 weight percent, in relation to the overall weight of the fiber-free dielectric layer. In other words, the manufacturing method may involve a multi-stage reduction of the solvent content of the dielectric layer. A first stage may be realized as a pre-baking stage prior to lamination. A second stage may be the lamination process itself, where also a certain additional amount of solvent may be removed out of the dielectric layer thanks to the application of heat and/or mechanical pressure during the lamination process. An optional third stage of solvent removal may relate to post-heating.

In an embodiment, the metal layer is a copper foil. A copper foil and a fiber-free dielectric layer may be directly connected to each other for example by lamination, i.e., the application of heat and/or pressure. Said lamination should however be sufficiently moderate in terms of temperature, pressure and timing in order to maintain an at least partially uncured property of the resin of the dielectric layer after lamination with the metal layer only.

In an embodiment, the fiber-free dielectric layer and the copper foil form a resin coated copper (RCC) structure. The use of RCC structures may make it possible to use a very thin dielectric layer, as compared to conventional prepreg sheets or the like used in standard semi-additive processing (SAP) architectures. The dielectric layer of the RCC may comprise for in-stance epoxy resin. For instance, the dielectric layer may be fiber-free prepreg material, a build-up material or film, etc.

In an embodiment, the method comprises reducing the amount of solvent so that the reduced amount of solvent is homogeneously or substantially homogeneously distributed over the dielectric layer. Correspondingly, the dielectric layer of the readily manufactured component carrier may be made of a substantially homogeneous material with a substantially homogeneous distribution of solvent. In other words, the dielectric layer on the metal layer may be free of pronounced variations of gradients of solvent or other material inhomogeneity, apart from tolerances and the like. A homogeneous solvent distribution suppresses thermal and mechanical stress in an interior of the component carrier and thereby contributes to high reliability and high performance.

In an embodiment, the metal layer directly connected to the fiber-free dielectric layer is a continuous metal layer when reducing the amount of solvent. Thus, the metal layer may be an uninterrupted metallic film of preferably constant thickness which may already be connected to the dielectric layer, as a mechanical support, before pre-baking.

In an embodiment, the method comprises patterning or (in particular partially or completely) removing the continuous metal layer after the laminating. For instance, the metal layer of the readily manufactured component carrier may be one of the group consisting of a continuous metal layer and a patterned metal layer, or the metal layer may not form part of the readily manufactured component carrier at all. Optionally, said metal layer may additionally comprise one or more vertical through connections, such as plated vias (in particular copper plated laser vias). Hence, when the build-up of the PCB stack has proceeded by laminating one or more RCC foils to one or both opposing sides, an exposed copper foil of an RCC structure may be structured (for instance by a laser or by a photolithography and etching process). It is also possible to form electrically conductive vertical through connections, such as copper filled laser vias, in a dielectric layer connected to such a patterned copper foil.

In an embodiment of the component carrier, the fiber-free dielectric layer connected to the stack has a solvent concentration of less than 0.1 weight percent, in particular of less than 0.05 weight percent, more particularly of less than 0.02 weight percent, in relation to the overall weight of the fiber-free dielectric layer. Such small amounts of residual solvent in the readily manufactured component carrier may be compatible with high reliability and high performance of the component carrier, and can be obtained when the amount of solvent in the double layer composed of dielectric layer and metal layer is reduced by pre-baking and subsequent lamination to the above-mentioned values.

In an embodiment, the dielectric layer of the readily manufactured component carrier has a glass transition temperature, Tg, above 150° C., in particular above 160° C. In particular, said glass transition temperature may be measured by a dynamic mechanical analysis (DMA). During DMA analysis, modulus and damping (in particular energy dissipation) properties of the dielectric material may be measured by deformation under periodic stress. During a DMA measurement for determining the glass transition temperature, both stress due to temperature and stress due to mechanically applied load may be applied. Therefore, the detected Tg value may be dependent from both, temperature and load. In the experiment, the mentioned Tg values have been obtained with a load corresponding to 49 mN. Descriptively speaking, the glass transition temperature of resin of the dielectric layer may denote a midpoint of a temperature range where the material undergoes a change between being brittle and rubbery. More specifically, glass transition may denote the gradual and reversible transition from a hard and relatively brittle glassy state into a viscous or rubbery state as the temperature is increased.

By the adjustability of the glass transition temperature by adjusting the residual solvent content in the dielectric layer, it is also possible to adjust the mechanical properties of the component carrier, such as the value of the Young modulus. Descriptively speaking, the solvent may act as a plasticizing agent. Solvent molecules are found between single polymer chains, enabling facilitated slippage of individual polymer chains. Therefore, the plastic properties are increased (as well as the Tg is suppressed to lower temperatures), and the elastic properties are decreased (depending on the polymer, the solvent as well as the solvent content). Hence, after removing the solvent, the Tg may be increased, as well as the Young modulus.

In an embodiment, the fiber-free dielectric layer comprises filler particles in a matrix of resin. Alternatively, the fiber-free dielectric layer comprises resin, which is free of filler particles, i.e., resin which does not include filler particles. Hence, it is optionally possible that the dielectric layer is provided with functional (for instance substantially spherical) particles, i.e., particles providing the dielectric layer with a specific function. For instance, such filler particles may be highly thermally conductive particles such as aluminum oxide or aluminum nitride beads, or electromagnetic radiation shielding magnetic particles.

In an embodiment, the component carrier comprises one or more components. Such a component may be surface mounted on the stack or on a double layer constituted by the dielectric layer and the metal layer. Alternatively, it is also possible that such a component is embedded in the stack and/or in a double layer constituted by the dielectric layer and the metal layer. In the context of the present application, the term "component" may particularly denote an inlay-type member. Such a component may be arranged in an interior of the stack. A component may in particular have an electronic function and may thus be a heat source in view of ohmic losses. For instance, such a component may be a semiconductor die. Embedding the component may result in a component being completely buried within stack material. However, embedding the component in the stack may also be accomplished by inserting the component in a cavity in the stack so that the component still has surface contact.

In an embodiment, the component carrier comprises a mold structure around at least part of the component and on at least one of the stack and the double layer (composed of dielectric layer and metal layer). A width of the mold structure may correspond to a width of the stack and of the double layer. Such an embodiment may be particularly appropriate when the component is surface mounted, for instance with a solder connection, on the stack with the laminated RCC foil(s). It is then possible that the surface mounted component is over molded with a mold compound, for instance by injection molding. Consequently, the surface mounted component may be encapsulated by the mold structure. As a result, a hybrid between a laminate-type component carrier and an encapsulated package may be obtained. Thanks to the limited amount of solvent in the laminate-type part of the hybrid component carrier, the material bridge between laminate-type materials and mold compound will not cause damage to the component carrier.

In another embodiment, one or more component is embedded in the stack and/or in one or more double layers each composed of dielectric layer and metal layer. Since such a component (for instance a semiconductor chip such as a silicon die) may have significantly different material properties than the component carrier material (in particular resin and copper, optionally reinforcing particles in the stack), such a component carrier with embedded component may be specifically prone to reliability issues as warpage and CTE (coefficient of thermal expansion) mismatch. Limiting the solvent content in the fiber-free dielectric layer(s), as described above, may contribute to a pronounced suppression or even elimination of such issues.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal, and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imagable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Delaware, U.S.A. Reinforcing structures such as webs, fibers, or spheres, for example made of glass (multilayer glass) may be used as well. Although prepreg particularly FR4 are usually preferred for rigid PCBs, other materials in particular epoxy-based build-up film or photo-imagable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be embedded in the stack, can be selected from a group consisting of an electrically non-conductive inlay (such as a ceramic inlay, preferable comprising aluminum nitride or aluminum oxide), an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer, or a further component carrier, for example in a board-in-board configuration. The component may be surface mounted on the component carrier and/or may be embedded in an interior thereof. Moreover, also other components, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
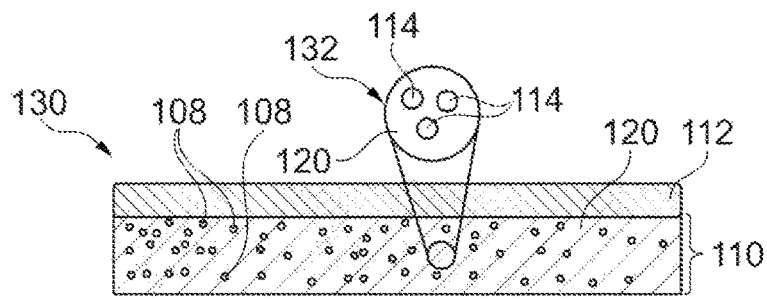
FIG. 1 illustrates a resin coated copper foil composed of a metallic layer and a dielectric layer with an initial amount of solvent.

The illustrations in the drawings are schematically presented. In different drawings, similar or identical elements are provided with the same reference signs.

Before referring to the drawings, exemplary embodiments will be de-scribed in further detail, some basic considerations will be summarized based on which exemplary embodiments of the invention have been developed.

During manufacturing resin coated copper (RCC) structures, a solvent or a mixture of solvent is usually required in a resin layer for manufacturing purposes.

However, it has been found by the present inventors that an excessive amount of solvent in a dielectric layer of an RCC structure may be a cause for reliability issues of a component carrier to which an RCC structure is laminated. Although some solvent may evaporate out of the resin layer of the RCC structure during lamination with a layer stack, the copper foil of the RCC structure may unintentionally function as a barrier for solvent evaporation during stack lamination.

According to an exemplary embodiment of the invention, a solvent amount in a resin layer of a resin coated copper (RCC) structure may be reduced by thermally induced semi-curing of the resin material in a separate manufacturing stage before laminating the RCC structure on a component carrier stack. By such a controlled pre-evaporation of part of a solvent content of RCC resin, the solvent content may be precisely adjusted in order to render the RCC particularly appropriate for a specific application. In other words, pre-baking the RCC before lamination may allow to get rid of part of the solvent to thereby promote solvent depletion in a fiber-free dielectric layer (for instance of pure resin). In particular, controlling the solvent content of the RCC resin may allow to adjust the glass transition temperature of the resin, i.e., may allow to adjust the temperature above which the polymer becomes softer and less brittle. Hence, the pre-lamination solvent reduction treatment of the RCC structure may be used as a design parameter for adjusting the properties of the RCC resin. In particular, processability and reliability issues which may result from an excessive solvent content may be efficiently prevented. Moreover, undesired phenomena such as warpage and/or delamination of the readily manufactured component carrier may be strongly suppressed. By having the opportunity to adjust (in particular increase) the glass transition temperature thanks to the solvent control architecture of an exemplary embodiment of the invention, it is also possible to precisely adjust the coefficient of thermal expansion (CTE), the Young modulus, etc., of the RCC resin. In particular, solvent reduction before lamination may hence allow to adjust the value of the glass transition temperature and the value of the Young modulus, and the characteristics of the flowability of the polymer may be set as well. Moreover, an additional solvent reduction stage before lamination of an RCC to a layer stack during build-up of a component carrier may allow to obtain smooth surfaces, a proper connection between copper and resin, and generally an improved reliability and performance. By low solvent content RCC processing, PCB processability of the RCC foils with adjustable conditions may be ensured. However, care should be taken during pre-treating an RCC foil for pre-lamination solvent reduction that the resin of the RCC foil is not fully cured during pre-treating. It can then be ensured that the solvent-depleted resin may function as an adhesive during subsequent lamination with a stack.

According to an exemplary embodiment of the invention, low solvent content RCC processing is made possible. According to exemplary embodiments of the invention, an architecture for manufacturing component carriers, such as printed circuit boards (PCBs) or integrated circuit (IC) substrates is provided, wherein such component carriers may be manufactured with high reliability and performance. Such a component carrier may be produced using one or more RCC foils which may be made subject to a controlled solvent removal process of removing an excess of solvent prior to lamination. Consequently, exemplary embodiments provide component carriers with high reliability and performance, wherein one or more RCC foils may be made subject to an additional control of the solvent content in the dielectric material.

The present inventors have surprisingly found that evaporation of solvent out of a dielectric layer of an RCC during lamination may be unintentionally inhibited or blocked by surrounding copper. Consequently, readily manufactured component carriers may suffer from an excessive amount of solvent in the dielectric layer of an RCC or the like. In order to overcome such shortcomings, an exemplary embodiment of the invention reduces the solvent amount in the dielectric layer of an RCC before lamination to a layer stack. More specifically, an additional drying or baking process may be integrated into the manufacturing process in order to reduce the solvent content in the dielectric layer below a 1.5 weight percent level, or even to a lower level. This may ensure to obtain a component carrier with a sufficiently small final solvent content and a sufficiently high glass temperature of the dielectric material (preferably measured by DMA, dynamic mechanical analysis) to reach a stable performance. By ensuring a sufficiently low solvent residue in the readily manufactured component carrier, a high and stable performance may be achieved.

Figure 2:
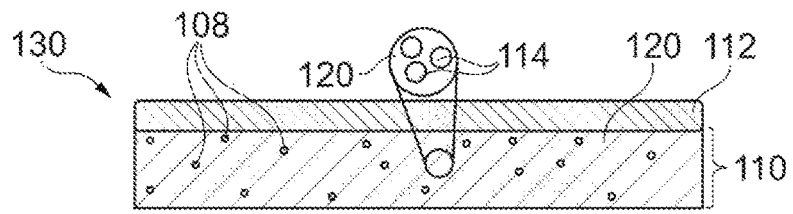
FIG. 2 illustrates the resin coated copper foil of FIG. 1 after reducing the amount of solvent in the dielectric layer by pre-heating.
Figure 3:
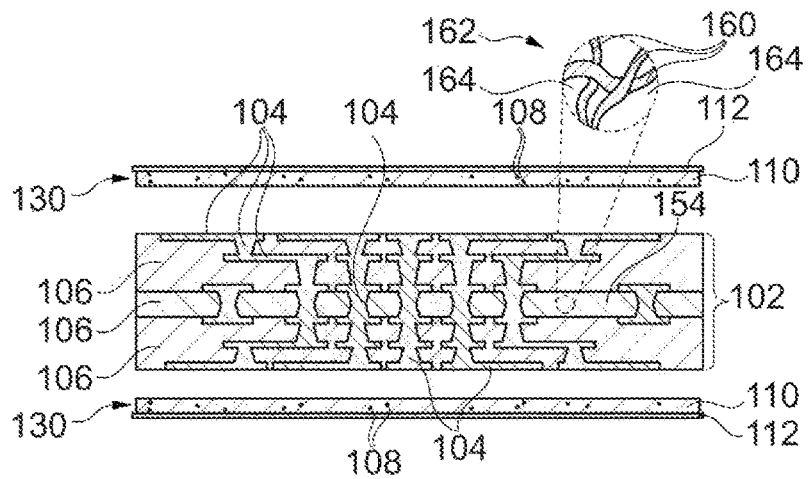
FIG. 3 illustrates constituents of a component carrier which comprise a central laminated layer stack and two resin coated copper foils pre-treated according to FIG. 2 and arranged close to two opposing main surfaces of the layer stack.
Figure 4:
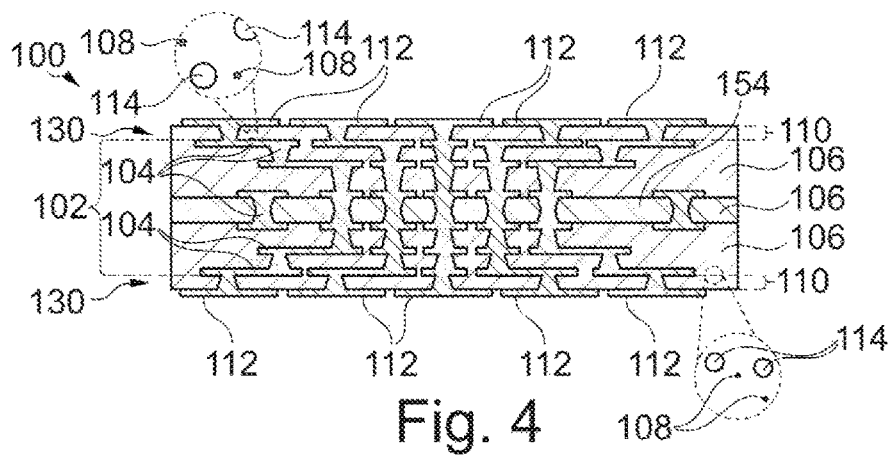
FIG. 4 illustrates a cross-sectional view of a component carrier according to an exemplary embodiment of the invention obtained by carrying out the manufacturing method according to FIG. 1 to FIG. 3.

FIG. 1 to FIG. 4 illustrate cross-sectional views of structures obtained during carrying out a method of manufacturing a component carrier 100 according to an exemplary embodiment of the invention, shown in FIG. 4, in low solvent content RCC technology.

FIG. 1 illustrates a cross-sectional view of a double layer 130 embodied as a resin coated copper foil (RCC). The double layer 130 is composed or consists of a metallic layer 112 and a dielectric layer 110 directly attached to the metal layer 112, i.e., without any other structure in between. A significant initial amount of solvent 108 may be contained in the dielectric layer 110. Such a solvent 108 may comprise for instance one or more organic solvents such as ethanol, methyl ethyl ketone (MEK), toluene, etc. Providing organic solvent 108 of significant amount in the dielectric layer 110 may be advantageous during manufacturing the RCC. Such a significant or excessive amount of solvent 108 in the dielectric layer 110 according to FIG. 1 may for instance be more than 2 weight percent or even more than 3 weight percent or more than 5 weight percent, in relation to the entire weight of dielectric layer 110.

In the present example of an RCC, the metal layer 112 of the double layer 130 is a copper foil. Alternatively, other metals can be used, such as nickel or aluminum. As shown in FIG. 1, the metal layer 112 being directly connected to the dielectric layer 110 is a continuous metal foil, i.e., a not yet patterned or structured foil.

Dielectric layer 110 may be a fiber-free electrically insulating layer. As shown in a detail 132, the dielectric layer 110 may comprise, apart from the solvent 108, a matrix 120 of partially or entirely uncured epoxy resin, and optionally filler particles 114. Further additives may be optionally included in the dielectric layer 110 as well (not shown). The partially or entirely uncured epoxy resin (in particular A-stage or B-stage resin) may still be capable of cross-linking or polymerizing in the presence of sufficient heat and/or pressure, may then become flowable and can thereby serve as an adhesive for connecting double layer 130 with a below described stack 102 during a lamination process. The double layer 130 may be free of, i.e., does not comprise, a network of glass fibers or glass cloth, which may be used in FR4 material of printed circuit boards as reinforcing fiber network. This renders dielectric layer 110 of the double layer 130 highly appropriate for forming vertical through connections such as copper filled laser vias.

While a significant amount of solvent 108 in dielectric layer 110 is appropriate during manufacturing the double layer 130, the present inventors have found that an excessive amount of solvent 108 in the double layer 130 may cause issues when laminating double layer 130 together with stack 100, and also in a readily manufactured component carrier 100, as shown in FIG. 4. Such issues may include a limited mechanical, electrical and thermal reliability of the component carrier 100, as well as a limited performance. Moreover, a component carrier 100 with such an excessive amount of solvent 108 in the dielectric layer 110 may cause warpage, may tend to delaminate, and other issues may occur as well. Furthermore, it has been found by the present inventors that an excessive amount of solvent 108 is not removed from dielectric layer 110 to a sufficient degree during the lamination process described referring to FIG. 3, since copper material of double layer 130 and of stack 102 may block evaporation of solvent 108 during lamination.

In order to overcome at least part of the mentioned and/or other shortcomings, an additional pre-lamination solvent reduction process can be carried out, for instance in the way as described in the following referring to FIG. 2.

FIG. 2 illustrates the resin coated copper foil of FIG. 1 after reducing the amount of solvent 108 in the dielectric layer 110.

Highly advantageously, FIG. 2 shows double layer 130 after reducing the amount of solvent 108 in the fiber-free dielectric layer 110 while being directly connected to metal layer 112. For instance, the amount of solvent 108 of the fiber-free dielectric layer 110 of the double layer 130 may be reduced up to less than 1.5 weight percent, preferably up to less than 1 weight percent, in relation to the overall weight of the fiber-free dielectric layer 110 by a pre-treatment described in the following in further detail. Said reduction of the content of solvent 108 in dielectric layer 110 may be controlled so that the dielectric layer 110 with reduced amount of solvent 108 remains at least partially uncured after the pre-treatment. In other words, dielectric layer 110 may be, after the solvent reduction process, for instance in B-stage, but not in C-stage. This has the advantage that the resin material of the dielectric layer 110 may still become flowable during the lamination process described below referring to FIG. 3, so that the dielectric layer 110 may contribute to an adhesion between double layer 130 and stack 102.

Preferably, reducing the amount of solvent 108 in the fiber-free dielectric layer 110 may be accomplished by pre-heating the fiber-free dielectric layer 110 connected with metal layer 112 to a compound. For pre-heating or pre-baking, the double layer 130 with the fiber-free dielectric layer 110 may be placed in an oven (not shown) and may be heated up to a temperature preferably in a range from 80° C. to 100° C. Preferably, pre-heating the fiber-free dielectric layer 110 in the mentioned temperature range may be carried out for a pre-heating time in a range from 5 minutes to 10 minutes. Highly advantageously, the pre-heating or pre-baking process may be carried out in a temperature and temporal range where the solvent 108 efficiently evaporates out of the dielectric layer 110 without excessive curing, polymerization or cross-linking of the at least partially uncured resin material of dielectric layer 110. By ensuring this, the dielectric layer 110 with reduced solvent content may be used later for adhesively connecting double layer 130 to stack 102. During this pre-heating process, an only partial curing of the fiber-free dielectric layer 110 may occur, so that the dielectric layer 110 may be thereafter in a semi-cured configuration. As a result of the process described referring to FIG. 2, the solvent content in the dielectric layer 110 after baking and prior to lamination may be less than 1.5 weight percent.

Advantageously, reducing the amount of solvent 108 may be carried out so that the reduced amount of solvent 108 is homogeneously distributed over the dielectric layer 110. Also, this contributes to a proper performance and high reliability of the readily manufactured component carrier 100 shown in FIG. 4.

Additionally or alternatively to the pre-heating for removing solvent 108 out of the double layer 130, it is also possible that such a removal may be accomplished by adjusting the environmental pressure and/or atmosphere, by applying mechanical pressure, etc. Highly advantageously, it may for instance be possible to additionally apply for instance a vacuum. In such a scenario, the temperature during pre-baking can be kept very low, and the curing behavior can be even more controlled. In addition to that, even solvents with higher boiling points can be removed at lower temperatures.

FIG. 3 illustrates still separate constituents of a component carrier 100 (shown in FIG. 4) which comprise a central laminated layer stack 102 and two resin coated copper foil-type double layers 130 treated according to FIG. 2 and arranged close to two opposing main surfaces of the layer stack 102.

Laminated layer stack 102 is composed of electrically conductive layer structures 104 and electrically insulating layer structures 106. For example, the electrically conductive layer structures 104 may comprise patterned copper foils and vertical through connections, for example copper filled laser vias. The electrically insulating layer structures 106 may comprise a resin 164 (such as epoxy resin) which may comprise reinforcing fibers 160 therein (for instance glass fibers), see detail 162. For instance, the electrically insulating layer structures 106 may be made of prepreg or FR4 or build-up film such as Ajinomoto Build-up Film® (ABF). Ajinomoto Build-up Film® is a registered mark of the Ajinomoto Co., Inc. 15-1, Kyobashi 1-chome, Chuo-ku Tokyo, Japan. The layer structures 104, 106 may be connected by lamination, i.e., the application of pressure and/or heat.

Core 154 in the center of stack 102 may be made of fully cured dielectric material, such as FR4, which may be partially covered by patterned copper foils on both opposing main surfaces. The various layer structures 104, 106 are built-up on the two opposing main surfaces of core 154 in a symmetrical way.

The electrically insulating layer structures 106 of stack 102 may or may not be fully cured. When being fully cured, adhesion between the stack 102 and the double layers 130 may be accomplished by partially uncured dielectric layer 110 curing for instance completely during lamination with stack 102. When the electrically insulating layer structures 106 of stack 102 are not yet fully cured (for instance comprise B-stage resin), they may also contribute to the connection with the double layers 130 during lamination.

As shown in FIG. 3, the double layers 130 are placed with respect to the stack 102 so that the dielectric layers 110 face a respective one of the two opposing main surfaces of the stack 102. Thereafter, structures 130, 102, 130 may be pressed together accompanied by heat which triggers lamination between the fiber-free dielectric layers 110 together with the metal layers 112 to the stack 102. During this lamination, the previously partially uncured dielectric layers 110 may be fully cured, for instance may be converted into C-stage resin.

During laminating the fiber-free dielectric layers 110 to the stack 102, a temperature of for example 190° C. may be adjusted. This ensures not only complete curing of the resin 120 of the dielectric layers 110 but also removes additional solvent 108 out of layers 110 by evaporation.

After said lamination of the double layers 130 to the stack 102, post-heating the fiber-free dielectric layer 110, the metal layer 112 and the stack 102 is possible by raising the temperature for instance up to 200° C. Such a post-heating may further increase the stability of the obtained component carrier 100 and may also remove yet another portion of the remaining solvent 108.

As a result of the processes described referring to FIG. 3, a remaining solvent content in the dielectric layer 110 after pre-baking and after lamination, and optionally after post-baking, may be less than 0.1 weight percent. After lamination, the glass transition temperature, Tg, of the resin of the dielectric layer 110, as measured by DMA, may be at least 150° C.

The described process allows to obtain a highly reliable component carrier 100 with high performance and low artefacts, such as warpage or delamination. Furthermore, adjusting the remaining content of solvent 108 allows adjusting the glass transition temperature and thereby also further parameters such as the Young modulus. Thus, the remaining solvent content may be used as a design parameter for creating a softer or more rigid component carrier 100.

FIG. 4 illustrates a cross-sectional view of component carrier 100 according to an exemplary embodiment of the invention obtained by carrying out the manufacturing method described above referring to FIG. 1 to FIG. 3.

After the lamination process described in FIG. 3, it is possible to further process the obtained structure, for instance by patterning the previously continuous exposed metal layers 112 of the RCC foils after the laminating, see FIG. 4.

The component carrier 100 shown in FIG. 4 is a plate-shaped laminate-type printed circuit board (PCB). The component carrier 100 comprises the laminated layer stack 102 composed of said electrically conductive layer structures 104 and said electrically insulating layer structures 106. A respective fiber-free dielectric layer 110 integrally connected to an assigned metal layer 112 is laminated to each main surface of the stack 102. Each dielectric layer 110 has a concentration of organic solvent 108 of preferably less than 0.1 weight percent in relation to the overall weight of the fiber-free dielectric layer 110. As shown, each dielectric layer 110 is arranged directly between a respective electrically conductive layer structure 104 of the stack 102 and an assigned metal layer 112. Preferably, the dielectric layer 110 may have a glass transition temperature above 150° C. Each fiber-free dielectric layer 110 may optionally comprise bead-shaped functional filler particles 114 in a matrix of resin 120.

Each of the exposed metal layers 112 is a patterned copper foil. Each dielectric layer 110 is made of a homogeneous material on the basis of epoxy resin 120 with a homogeneous low distribution of solvent 108. For instance, the solvent 108 comprises one or more of alcohols, such as ethanol or 1-methoxy 2-propanol, ketones, such as methyl ethyl ketone or cyclohexanone, glycol derivatives, such as propylene glycol methyl ether acetate or diethylene glycol monoethyl ether acetate, amides such as dimethylformamide, benzene derivatives, such as toluene, or cyclic and/or aliphatic (saturated or non-saturated) hydrocarbons, such as naphtha.

Figure 5:
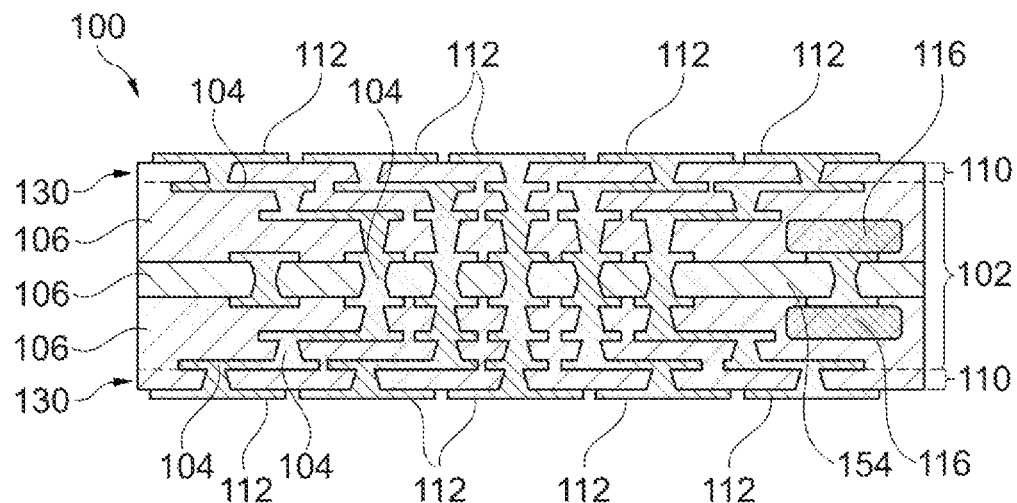
FIG. 5 illustrates a cross-sectional view of a component carrier with embedded components according to another exemplary embodiment of the invention.

FIG. 5 illustrates a cross-sectional view of a component carrier 100 according to another exemplary embodiment of the invention having embedded components 116.

The embodiment of FIG. 5 differs from the embodiment of FIG. 4 in that, in the embodiment of FIG. 5, one or more (here: two) components 116 (for instance semiconductor chips such as silicon dice) is/are embedded in the stack 102. Due to the fundamentally different material properties of the component(s) 116 (predominantly semiconductor material) on the one hand and of the stack 102 and the double layers 130 (for instance copper, resin and glass) on the other hand, including significantly different properties in terms of the coefficient of thermal expansion (CTE), it is of utmost advantage that a considerable amount of solvent 108 is removed from the double layers 130 prior to lamination and additionally during lamination to keep thermal stress, warpage and other undesired phenomena small.

Figure 6:
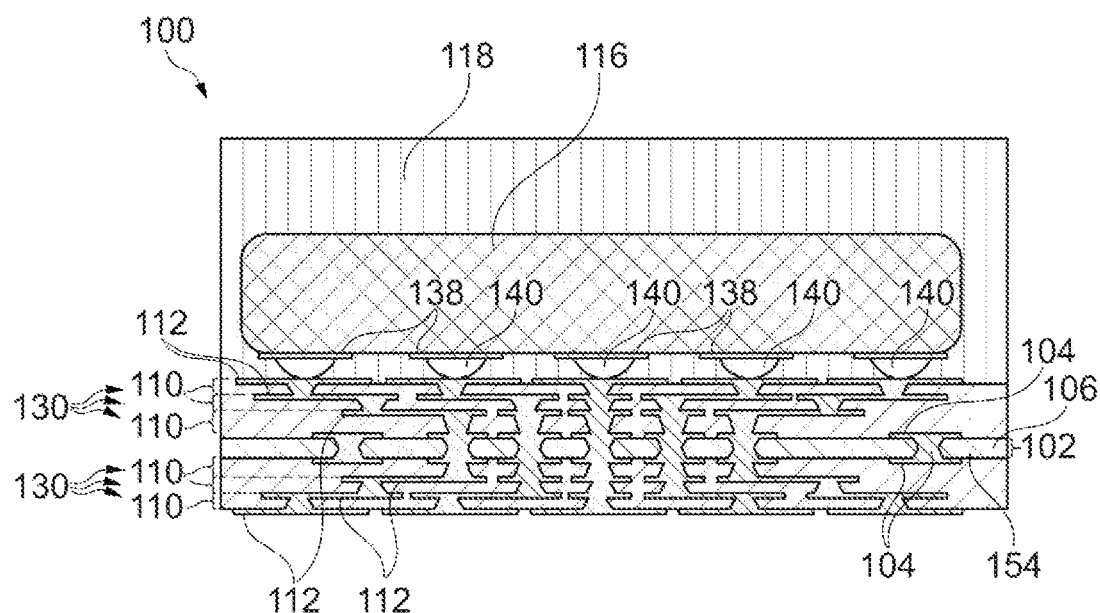
FIG. 6 illustrates a cross-sectional view of a component carrier with surface mounted and molded component according to still another exemplary embodiment of the invention.

FIG. 6 illustrates a cross-sectional view of a component carrier 100 according to still another exemplary embodiment of the invention having a surface mounted component 116 which is over molded by a mold structure 118.

Hence, the component carrier 100 of FIG. 6 comprises an SMD com-ponent 116, i.e., a component 116 being surface mounted on the stack 102 cladded in this embodiment on both opposing main surfaces with multiple double layers 130. Component 116 is soldered on an uppermost patterned metal layer 112 of one of the RCC-type double layers 130. In order to mechanically protect and electrically insulate component 116, the component carrier 100 comprises a mold structure 118 around the component 116.

Descriptively speaking, the embodiment of FIG. 6 shows an electronic package with RCC substrate. Surface mounted component 116 (which may be a semiconductor chip) may be encapsulated in mold structure 118, for instance by injection molding. The IC substrate below may be produced with RCC materials. More specifically, the SMD (surface mounted device)-type component 116 according to FIG. 6 may be solder-connected at its pads 138 to solder structures 140 (such as solder balls or solder bumps) on top of the IC substrate composed of central stack 102 and multiple RCC structures (see reference signs 130) built up on both opposing main surfaces of stack 102 symmetrically. Before or after soldering, component 116 may be over molded by mold structure 118.

Still referring to FIG. 6, it may be alternatively possible in other embodiments that an RCC foil (i.e., a double layer 130) is only present at an interface between the laminated layers and the mold compound of FIG. 6 (i.e., on the side of the component 116 which is placed onto the PCB-type laminated layer stack). In other words, only the uppermost double layer 130 in FIG. 6 may be present, and the other double layers 130 shown in FIG. 6 may be replaced by prepreg layers in combination with copper structures, or the like.

It should be noted that the term "comprising" does not exclude other elements or steps and the use of the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of manufacturing a plate-shaped component carrier, wherein the plate-shaped component carrier is configured as one of a group consisting of a printed circuit board, an IC substrate, and an interposer, the method comprising:
   forming a stack comprising at least one electrically conductive layer structure and at least one electrically insulating layer structure, wherein the layer structures are provided in a plate form;
   reducing an amount of solvent in a fiber-free dielectric layer by pre-heating the fiber-free dielectric layer, which is directly connected to a metal layer, in such a way that the dielectric layer with a reduced amount of solvent remains at least partially uncured, and
   thereafter, in a separate manufacturing stage, laminating the fiber-free dielectric layer together with the metal layer to the stack by at least partially curing the dielectric layer.

2. The method according to claim 1, wherein the pre-heating comprises pre-heating the fiber-free dielectric layer up to a temperature in a range from 60° C. to 160° C.

3. The method according to claim 1, wherein the pre-heating comprises pre-heating the fiber-free dielectric layer for a preheating time in a range from 5 minutes to 20 minutes.

4. The method according to claim 1, wherein the pre-heating comprises pre-heating the fiber-free dielectric layer to an elevated temperature above ambient temperature but below the glass transition temperature of resin of the fiber-free dielectric layer.

5. The method according to claim 1, wherein the method comprises reducing the amount of solvent in the fiber-free dielectric layer by applying a negative pressure.

6. The method according to claim 1, wherein the method comprises only partially curing the fiber-free dielectric layer during the reducing of the amount of solvent.

7. The method according to claim 1, wherein the method comprises fully curing the fiber-free dielectric layer by the laminating.

8. The method according to claim 1, wherein the method comprises laminating the fiber-free dielectric layer to the stack at a temperature of at least 180° C.

9. The method according to claim 1, wherein the method comprises
   after laminating the fiber-free dielectric layer to the stack, post-heating the fiber-free dielectric layer, the metal layer, and the stack up to a temperature in a range from 120° C. to 260° C.

10. The method according to claim 1, wherein the method comprises reducing the amount of solvent of the fiber-free dielectric layer before the laminating up to less than 1.5 weight percent in relation to the overall weight of the fiber-free dielectric layer.

11. The method according to claim 1, wherein the method comprises further reducing the amount of solvent of the fiber-free dielectric layer by the laminating up to less than 0.15 weight percent in relation to the overall weight of the fiber-free dielectric layer.

12. The method according to claim 1, further comprising at least one of the following features:
   wherein the fiber-free dielectric layer and the metal layer form a double layer;
   wherein the reduced amount of solvent is homogeneously distributed over the dielectric layer.

13. The method according to claim 1, wherein the metal layer directly connected to the fiber-free dielectric layer is a continuous metal layer when reducing the amount of solvent.

14. The method according to claim 13, wherein the method comprises patterning or removing the continuous metal layer after the laminating.

* * * * *